US012604595B2

(12) United States Patent
Kuo et al.

(10) Patent No.: US 12,604,595 B2
(45) Date of Patent: Apr. 14, 2026

(54) DISPLAY DEVICE AND SPLICING DISPLAY DEVICE

(71) Applicant: Innolux Corporation, Miao-Li County (TW)

(72) Inventors: Shu-Ming Kuo, Miao-Li County (TW); Tsau-Hua Hsieh, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 856 days.

(21) Appl. No.: 17/695,859

(22) Filed: Mar. 16, 2022

(65) Prior Publication Data

US 2022/0336782 A1    Oct. 20, 2022

(30) Foreign Application Priority Data

Apr. 15, 2021    (CN) .......................... 202110406651.0

(51) Int. Cl.
*H01L 51/52*          (2006.01)
*H01L 25/075*         (2006.01)
(Continued)

(52) U.S. Cl.
CPC ....... *H01L 25/0753* (2013.01); *H10K 50/841* (2023.02); *H10K 50/865* (2023.02);
(Continued)

(58) Field of Classification Search
CPC ......... H01R 13/7175; H01H 2219/036; H10K 59/90; H10K 59/95; H10K 59/70;
(Continued)

(56) References Cited

U.S. PATENT DOCUMENTS 6,159,323 A      12/2000  Joly et al.
2019/0122592 A1*  4/2019  Han ....................... G09F 9/3026
(Continued)

FOREIGN PATENT DOCUMENTS

CN          112447118          3/2021

OTHER PUBLICATIONS

Office Action of Europe Counterpart Application, Issued on May 24, 2024 (Year: 2024).*

(Continued)

*Primary Examiner* — Lawrence C Tynes, Jr.
(74) *Attorney, Agent, or Firm* — JCIPRNET

(57)                    ABSTRACT

A display device and a splicing display device are provided. The display device includes a substrate layer, a capping layer, and a light-emitting element. The capping layer is disposed on the substrate layer and has a light-exiting region. The light-emitting element is disposed on the substrate layer and emits light toward the light-exiting region of the capping layer. A distance from the light-exiting region to the side surface of the capping layer is defined as D. A thickness of the capping layer is defined as T. A refractive index of the capping layer is defined as $n1$. D, T, and $n1$ meet the following equation: $\mathrm{Tan}^{-1}(D/T) > \mathrm{Sin}^{-1}(1/n1)$. The splicing display device includes a plurality of display devices, and the display devices are spliced together. In the display device and the splicing display device, optical defects such as a shining edge, a ghost image, or a shadow effect are reduced.

20 Claims, 2 Drawing Sheets

(51) Int. Cl.

| | |
|---|---|
| *H01L 27/32* | (2006.01) |
| *H10K 50/84* | (2023.01) |
| *H10K 50/86* | (2023.01) |
| *H10K 59/38* | (2023.01) |
| *H10K 59/80* | (2023.01) |

(52) U.S. Cl.
CPC ........... *H10K 59/38* (2023.02); *H10K 59/871* (2023.02); *H10K 59/8792* (2023.02)

(58) Field of Classification Search
CPC .. H10K 59/871; H10K 59/8792; H10K 59/38; H10K 50/00; H10K 50/841; H10K 50/865; H10K 77/10; H05K 2201/10106; H01L 25/16; H01L 25/167; H01L 25/0753; H01L 33/44; H01L 33/50; F21K 9/60; H01S 5/20; G09F 2013/1863; G09F 9/33; G02F 1/133502; G06F 9/3555; G06F 16/2264; G02B 6/03605; G01N 2021/4126; G01N 21/412; G03H 2240/54

See application file for complete search history.

(56) References Cited

U.S. PATENT DOCUMENTS

| | | | | |
|---|---|---|---|---|
| 2019/0305073 A1 * | 10/2019 | Chen | .................... | H01L 25/0753 |
| 2020/0219858 A1 * | 7/2020 | Chang | ................. | H01L 25/0756 |
| 2020/0235261 A1 * | 7/2020 | Hu | ....................... | H01L 25/0753 |
| 2021/0265457 A1 * | 8/2021 | Yueh | ...................... | H10K 59/18 |

OTHER PUBLICATIONS

"Search Report of Europe Counterpart Application", issued on Sep. 5, 2022, p. 1-p. 9.
"Office Action of Europe Counterpart Application", issued on May 24, 2024, pp. 1-5.

* cited by examiner

DISPLAY DEVICE AND SPLICING DISPLAY DEVICE

CROSS-REFERENCE TO RELATED APPLICATION

This application claims the priority benefit of China application serial no. 202110406651.0, filed on Apr. 15, 2021. The entirety of the above-mentioned patent application is hereby incorporated by reference herein and made a part of this specification.

BACKGROUND

Technical Field

The present disclosure relates to a display device and a splicing display device, and in particular to a display device and a splicing display device which reduce shining edges, ghost images, or shadow effects.

Description of Related Art

Display panels are currently widely used in electronic appliances such as mobile phones, televisions, monitors, tablet computers, car monitors, wearable devices, and desktop computers. With the vigorous development of electronic products, requirements for display quality of electronic products are increasingly higher. Therefore, electronic devices used for display are continuously being improved towards having larger or higher resolution display effects.

SUMMARY

The present disclosure provides a display device and a splicing display device, which reduce optical defects such as a shining edge, a ghost image, or a shadow effect.

According to an embodiment of this disclosure, a display device includes a substrate layer, a capping layer, and a light-emitting element. The capping layer is disposed on the substrate layer and has a light-exiting region. The light-emitting element is disposed on the substrate layer and emits light toward the light-exiting region of the capping layer. A distance from the light-exiting region to a side surface of the capping layer is defined as D. A thickness of the capping layer is defined as T. A refractive index of the capping layer is defined as n1. D, T, and n1 meet the following equation: $\mathrm{Tan}^{-1}(D/T) > \mathrm{Sin}^{-1}(1/n1)$.

According to an embodiment of this disclosure, a splicing display device includes a plurality of the above-mentioned display devices, and the display devices are spliced together.

BRIEF DESCRIPTION OF THE DRAWINGS

The accompanying drawings are included to further illustrate the present disclosure, and the accompanying drawings are incorporated into this specification and constitute a part of this specification. The accompanying drawings illustrate the embodiment of the present disclosure, and are used to explain the principle of the present disclosure together with the description.

DESCRIPTION OF THE EMBODIMENTS

Figure 1:
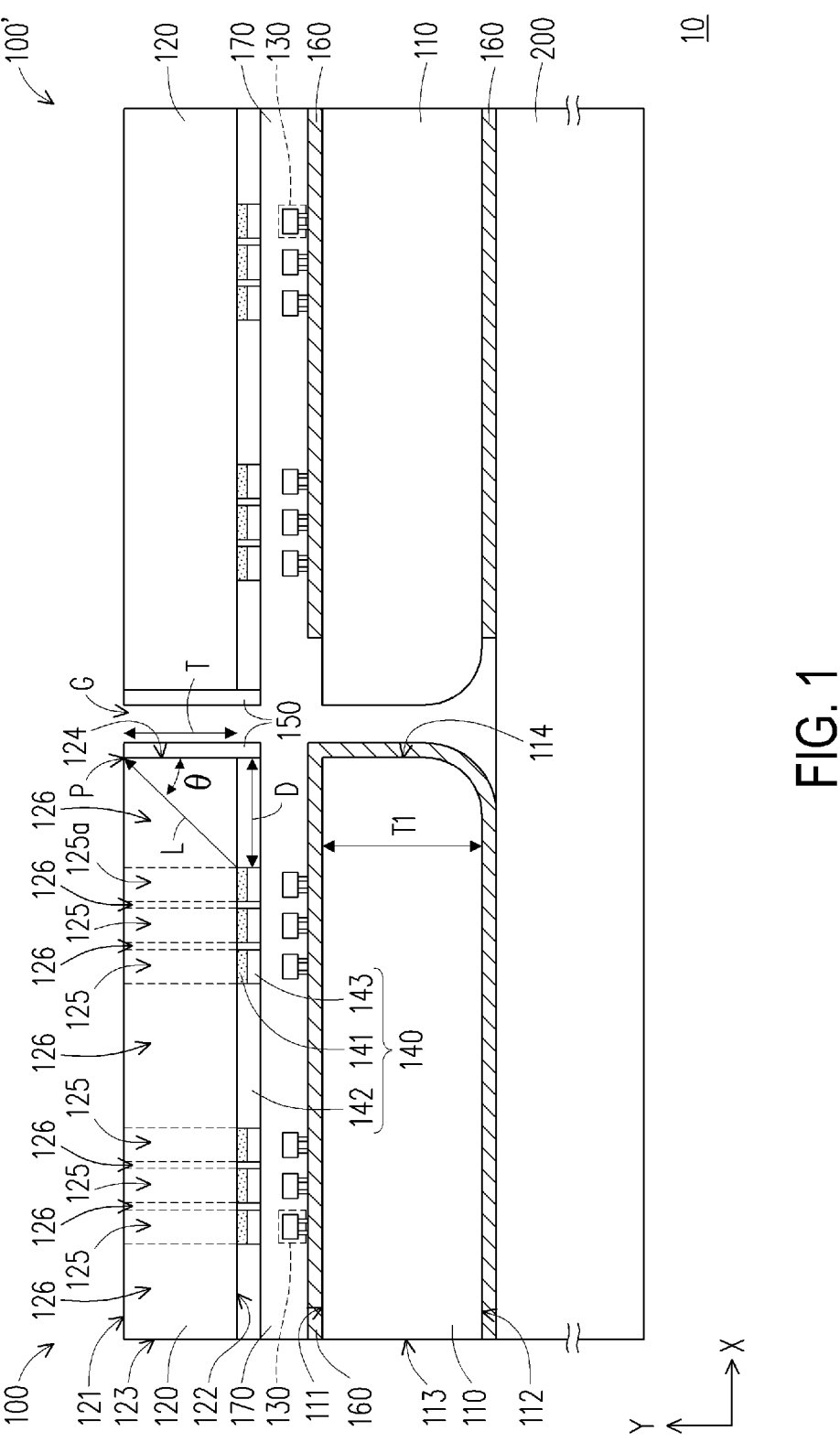
FIG. 1 is a schematic cross-sectional view of a splicing display device according to an embodiment of the disclosure.

This disclosure may be understood by referring to the following detailed description in connection with the accompanying drawings. It should be noted that, in order to make it easier for readers to understand and to simplify the drawings, only a portion of a light-emitting device is drawn in the multiple drawings in this disclosure. And specific elements in the drawings are not drawn according to actual scale. In addition, the number and size of each element in the drawings are only for illustration, and are not used to limit the scope of the disclosure.

In the following descriptions of the specification and claims, words such as "contain" and "include" are open-ended terms, so they should be interpreted as meaning "containing but not limited to . . . ".

It should be understood that when an element or a film layer is said to be "on" or "connected" to another element or film layer, it may be directly on said another element or film layer or directly connected to said another element or film layer, or there is an element or film layer (an indirect situation) inserted between the two. Conversely, when an element is said to be "directly" on another element or film layer or "directly connected" to another element or film layer, there is no element or film layer inserted between the two.

Although the terms "first", "second", "third" . . . may be used to describe various constituent elements, the constituent elements are not limited to the terms. The terms are only used to distinguish a single component element from other components in the specification. The same terms may not be used in the claims, and may be replaced with first, second, third . . . in the order in which the elements are declared in the claims. Therefore, the first constituent element in the following description may be the second constituent element in the claims.

In the description, the terms "about", "approximately", "substantially", and "roughly" usually mean within 10%, or within 5%, or within 3%, or within 2%, or within 1%, or within 0.5% of a given value or range.

In some embodiments disclosed in this disclosure, terms regarding bonding and connection such as "connection", "interconnection", etc., unless specifically defined, may indicate that two structures are in direct contact, or may indicate that two structures are not in direct contact and there are other structures located between these two structures. In addition, terms regarding bonding and connection may further include situations where both structures are movable, or both structures are fixed. In addition, the term "coupled" includes any direct and indirect electrical connection methods.

In this disclosure, the length and width may be measured by using an optical microscope, and the thickness may be obtained by measuring a cross-sectional image in an electronic microscope, but the disclosure is not limited thereto. In addition, there may be a certain error in any two values or directions used for comparison.

An electronic device disclosed in the present disclosure may include a display device, an antenna device (such as a liquid crystal antenna), a sensing device, a light emitting device, a touch device, or a splicing device, but the disclosure is not limited thereto. The electronic device may include a bendable and flexible electronic device. The appearance of the electronic device may be a rectangle, a circle, a polygon, a shape with a curved edge, or other suitable shapes. The display device may, for example, include a light emitting diode (LED), a liquid crystal, fluorescence, a phosphor, a quantum dot (QD), other suitable materials or a combination of the foregoing, but the disclosure is not limited thereto. The light emitting diode may, for example, include an organic light emitting diode (OLED), an inorganic light emitting diode, a micro light emitting diode (mini LED), a micro light emitting diode (micro LED), or a quantum dot light emitting diode (QLED, QDLED), other suitable materials or any combination of the foregoing, but the disclosure is not limited thereto. The display device may also include a splicing display device, but the disclosure is not limited thereto. The antenna device may be, for example, a liquid crystal antenna, but the disclosure is not limited thereto. The antenna device may, for example, include an antenna splicing device, but the disclosure is not limited thereto. It should be noted that the electronic device may be any combination of the foregoing, but the disclosure is not limited thereto. In addition, the appearance of the electronic device may be a rectangle, a circle, a polygon, a shape with a curved edge, or other suitable shapes. The electronic device may have peripheral systems such as a drive system, a control system, a light source system, and a shelf system to support the display device, the antenna device, or the splicing device. Hereinafter, the display device will be used to illustrate the content of this disclosure, but the disclosure is not limited thereto.

It should be noted that in the following embodiments, features in several different embodiments may be replaced, reorganized, and mixed to complete other embodiments without departing from the spirit of this disclosure. As long as the features of each embodiment do not violate the spirit of the disclosure or conflict, they may be mixed and matched.

Reference will now be made in detail to the exemplary embodiment disclosed in the present disclosure, and examples of the exemplary embodiment are illustrated in the accompanying drawings. Whenever possible, the same reference numerals are used in the drawings and descriptions to indicate the same or similar parts.

FIG. 1 is a schematic cross-sectional view of a splicing display device according to an embodiment of the disclosure. Referring to FIG. 1, a splicing display device 10 of this embodiment includes a plurality of display devices 100 and 100' and a carrier 200. The display devices 100 and 100' are disposed on the carrier 200, and the display devices 100 and 100' are spliced with each other. In this embodiment, the display device 100 and the display device 100' are disposed adjacent to each other, and there is a seam G between the display device 100 and the display device 100', and the seam G has a spacing between the display device 100 and the display device 100'. In other words, the spacing may be defined as a minimum distance between a light absorbing layer 150 of the display device 100 and the light absorbing layer 150 of the display device 100'. In this embodiment, the carrier 200 may include a hard substrate, a soft substrate or a combination of the forgoing. For example, the material of the carrier 200 may include glass, quartz, sapphire, ceramics, polycarbonate (PC), polyimide (PI), polyethylene terephthalate (PET), other suitable carrier materials, or a combination of the forgoing, but is not limited thereto. The following takes the display device 100 as an example for description.

In this embodiment, the display device 100 includes a substrate layer 110, a capping layer 120, and a light-emitting element 130. The substrate layer 110 has a surface 111, a surface 112, a side surface 113, and a side surface 114. The surface 111 and the surface 112 are opposite to each other, and the side surface 113 may connect the surface 111 and the surface 112, and the side surface 114 may connect the surface 111 and the surface 112. The side surface 114 is adjacent to the display device 100'. In this embodiment, the material of the substrate layer 110 may include glass, polyimide (PI), quartz or sapphire, but is not limited thereto. In some embodiments, the display device 100 further includes a drive circuit (not shown). The drive circuit (not shown) may be disposed on the substrate layer 110, and the drive circuit (not shown) may be an active drive circuit. In some embodiments, the drive circuit (not shown) may include a transistor, a data line, a scanning line, other electronic elements, or a combination of the forgoing, but is not limited thereto.

In this embodiment, the capping layer 120 is disposed on the substrate layer 110. The capping layer 120 has a surface 121, a surface 122, a side surface 123, and a side surface 124. The surface 121 and the surface 122 are opposite to each other, and the side surface 123 and the side surface 124 are opposite to each other. The side surface 123 may connect the surface 121 and the surface 122, and the side surface 124 may connect the surface 121 and the surface 122, too. The surface 121 of the capping layer 120 is away from the surface 111 of the substrate layer 110, and the surface 122 of the capping layer 120 is adjacent to the surface 111 of the substrate layer 110. The side surface 124 faces the display device 100'. The surface 121 of the capping layer 120 and the side surface 124 of the capping layer 120 may have a point of intersection P. The capping layer 120 has a light-exiting region 125 and a non-light-exiting region 126, and the light-exiting region 125 and the non-light-exiting region 126 may be arranged at intervals. The material of the capping layer 120 may include polyimide, quartz, sapphire or glass, but is not limited thereto.

In this embodiment, the light-emitting element 130 is disposed on the surface 111 of the substrate layer 110, and emits light toward the light-exiting region 125 of the capping layer 120. The light-emitting element 130 is disposed between the capping layer 120 and the substrate layer 110. The light-emitting element 130 is disposed corresponding to the light-exiting region 125 of the capping layer 120; that is, the light-emitting element 130 overlaps the light-exiting region 125 of the capping layer 120 in a normal direction Y of the substrate layer 110. In this embodiment, the light-emitting element 130 may be, for example, a red LED, a green LED, a blue LED, a white LED, and/or an ultraviolet LED (UV LED), but the disclosure is not limited thereto.

In addition, in this embodiment, a thickness of the capping layer 120 may be defined as T, a thickness of the substrate layer 110 may be defined as T1, and the thickness T of the capping layer 120 is different from the thickness T1 of the substrate layer 110. The thickness T may be, for example, a maximum thickness of a section measured along the normal direction Y of the capping layer 120; the thickness T1 may be, for example, a maximum thickness of a section measured along the normal direction Y of the substrate layer 110. In this embodiment, when the thickness T of the capping layer 120 is, for example, smaller than the thickness T1 of the substrate layer 110, the substrate layer 110 may be thicker than the capping layer 120 for supporting or bearing purposes, or the capping layer 120 may be thinner than the substrate layer 110 to reduce optical defects. The optical defect may be, for example, a shining edge, a ghost image or a shadow effect at the seam of the splicing display device. For example, when the capping layer is too thick, the light emitted by the light-emitting element toward the side surface of the capping layer passes through the side surface of the capping layer due to refraction, thereby causing optical defects such as a shining edge or a ghost image at the seam (or on the side surface of the display device in the splicing display device). When the capping layer is too thick and the side surface of the capping layer has a light absorbing material disposed, the light emitted by the light-emitting element toward the side surface of the capping layer is absorbed by the light absorbing material, and therefore cannot pass through the side surface of the capping layer through refraction, thereby causing optical defects such as a shadow effect at the seam (for example, the side surface of the display device in the splicing display device) of the splicing display device, especially when the user views the splicing display device with a large angle of view.

Therefore, in this embodiment, through adjusting the thickness T of the capping layer 120, the light from the light-emitting element 130 toward the side surface 124 of the capping layer 120 is refracted towards the direction of a large angle of view (for example, the direction perpendicular to the normal direction Y of the substrate layer 110, that is, a direction X) or absorbed by the light absorbing material. Specifically, in this embodiment, in a section, the shortest distance from a light-exiting region 125a closest to the seam G to the side surface 124 of the capping layer 120 is defined as D, the refractive index of the capping layer 120 is defined as n1, and the distance D, the thickness T, and the refractive index n1 are designed to meet the following equation: $Tan^{-1}(D/T)>Sin^{-1}(1/n1)$. Therefore, under general conditions (approximately 1 atmosphere pressure, approximately 25° C. atmospheric conditions), when an angle between the light toward the point of intersection P and the side surface 124 is θ, the angle θ may be substantially equal to $Tan^{-1}(D/T)$, and $Sin^{-1}(1/n1)$ may substantially be a critical angle of the capping layer 120. In this way, the light toward the point of intersection P may pass through the side surface 124 of the capping layer 120 and be refracted toward the direction of the large angle of view (for example, the direction X, but not limited thereto), and other light (that is, the light whose angle with the side surface 124 is greater than the critical angle) toward the side surface 124 may be absorbed by the light absorbing material. Thus, in the splicing display device 10 of this embodiment, the problem of optical defects such as a shining edge, a ghost image or a shadow effect at the seam G of the splicing display device 10 may be reduced. For example, when the capping layer 120 is glass (the refractive index n1 is about 1.5) and the distance D is about 150 microns (μm), the thickness T of the capping layer 120 should be less than 202.2 microns.

In this embodiment, the display device 100 may further include an optical layer 140, disposed on the surface 122 of the capping layer 120. The optical layer 140 is disposed between the capping layer 120 and the light-emitting element 130. The optical layer 140 includes a color filter layer 141 and a light blocking matrix 142. The color filter layer 141 may be disposed below the capping layer 120 and the color filter layer 141 may be disposed corresponding to the light-exiting region 125 of the capping layer 120. The light blocking matrix 142 may be disposed below the capping layer 120 and the light blocking matrix 142 may be disposed corresponding to the non-light-exiting region 126 of the capping layer 120. In other words, the color filter layer 141 overlaps the light-exiting region 125 of the capping layer 120 in the normal direction Y of the substrate layer 110, and the light blocking matrix 142 overlaps the non-light-exiting region 126 of the capping layer 120 in the normal direction Y of the substrate layer 110. The light blocking matrix 142 may define the boundary of the light-exiting region 125 of the capping layer 120. In some embodiments, the light blocking matrix 142 may be, for example, a black matrix or a gray matrix, and the material of the light blocking matrix 142 may, for example, include metal, opaque resin, other suitable materials, or a combination of the above materials, but is not limited thereto.

In this embodiment, the optical layer 140 may further include a color conversion layer 143, the color conversion layer 143 may be disposed corresponding to the light-exiting region 125 of the capping layer 120 and the color filter layer 141, and the color conversion layer 143 may be disposed below the color filter layer 141. The color conversion layer 143 may overlap the light-exiting region 125 of the capping layer 120 in the normal direction Y of the capping layer 120. The color conversion layer 143 may also overlap the color filter layer 141 in the normal direction Y of the capping layer 120. The material of the color conversion layer 143 may include quantum dots, fluorescence, phosphorescence or a combination of the forgoing, but is not limited thereto.

In this embodiment, the display device 100 may include a light absorbing layer 150, disposed on the side surface 124 of the capping layer 120. The light absorbing layer 150 may be used to absorb the light (for example, the light whose angle θ is greater than the critical angle) from the light-emitting element 130 toward the side surface 124 of the capping layer 120 to reduce optical defects such as a shining edge or a ghost image at the seam G of the splicing display device 10. The light absorbing layer 150 may include a light absorbing material, and the light absorbing material is, for example, a resin containing light absorbing particles or a resin containing light absorbing pigments, but is not limited thereto. In some embodiments, the light absorbing layer 150 may be glued or tape, but the is not limited thereto.

In this embodiment, the display device 100 may further include a trace layer 160 and an adhesive layer 170. The trace layer 160 is disposed on the surface 111, the surface 112, and the side surface 114 of the substrate layer 110. The trace layer 160 located on the surface 111 of the substrate layer 110 may be electrically connected to the light-emitting element 130. The trace layer 160 located on the surface 112 of the substrate layer 110 may be electrically connected to a circuit element (not shown). The circuit element may be, for example, a gate on panel (GOP), but is not limited thereto. The adhesive layer 170 is disposed between the optical layer 140 and the substrate layer 110, and surrounds the light-emitting element 130. The adhesive layer 170 is disposed between the optical layer 140 and the trace layer 160 to fix the capping layer 120 on the substrate layer 110. The material of the adhesive layer 170 may be, for example, an optically clear adhesive (OCA) or an optical clear resin (OCR), but is not limited thereto.

In short, in the display devices 100 and 100' and the splicing display device 10 of the embodiment disclosed in this disclosure, since the distance D from the light-exiting region 125a to the side surface 124 of the capping layer 120, the thickness T of the capping layer 120, and the refractive index n1 of the capping layer 120 may meet the equation: $Tan^{-1}(D/T)>Sin^{-1}(1/n1)$, optical defects such as a shining edge, a ghost image, or a shadow effect at the seam G (or the side surface 124 of the display device 100 in the splicing display device 10) of the splicing display device 10 may be reduced.

Another embodiment will be listed below as an illustration. It must be noted here that the reference numerals and part of the content of the aforementioned embodiment are used in the following embodiment, and the same numerals are used to represent the same or similar elements, and the description of the same technical content is omitted. The aforementioned embodiment may be referred to for the description of the omitted part, which will not be repeated in the following embodiment.

Figure 2:
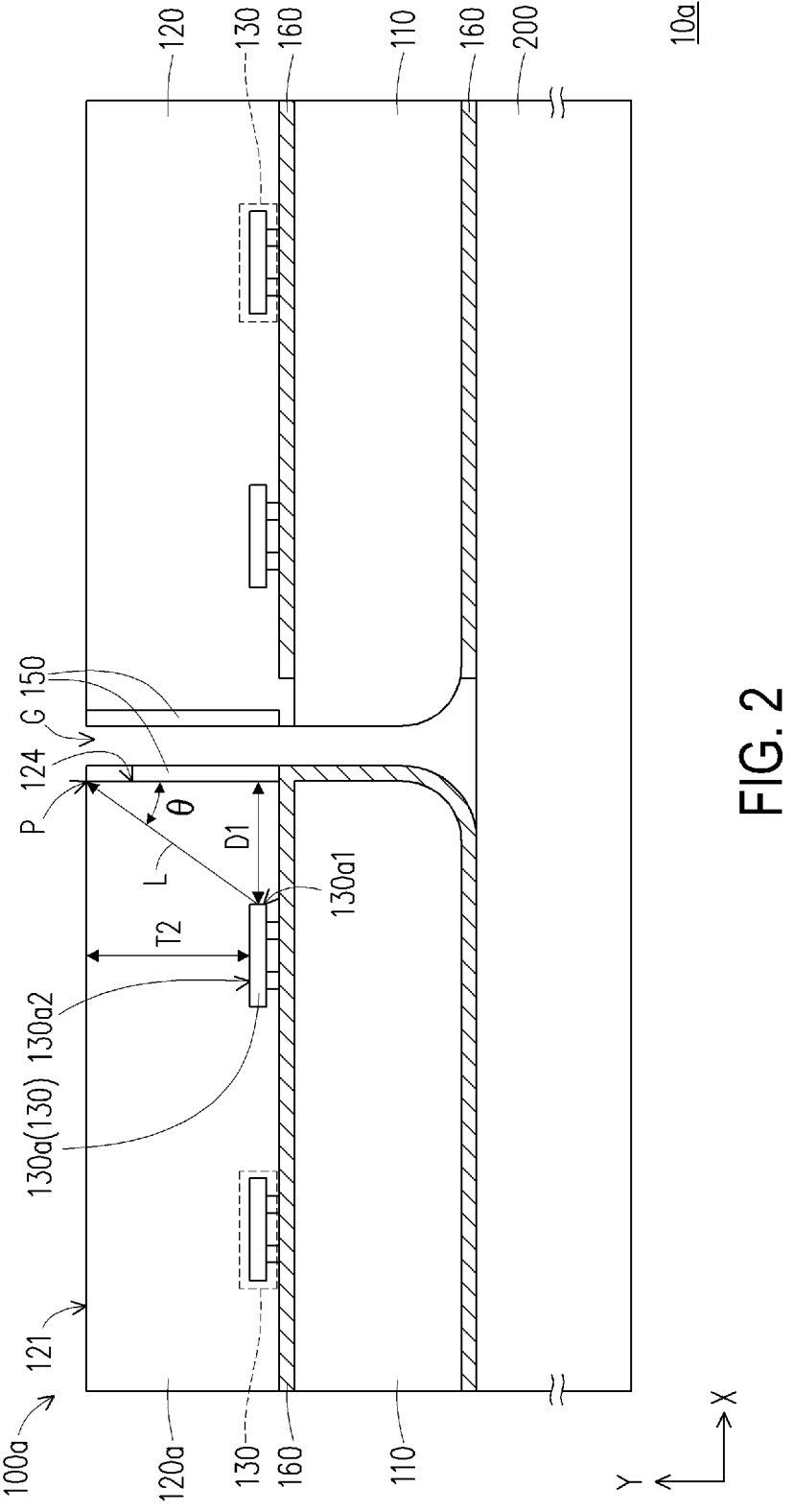
FIG. 2 is a schematic cross-sectional view of a splicing display device according to another embodiment of the disclosure.

FIG. 2 is a schematic cross-sectional view of a splicing display device according to another embodiment of the disclosure. Referring to FIGS. 1 and 2 at the same time, a splicing display device 10*a* of this embodiment is roughly similar to the splicing display device 10 of FIG. 1, so the same and similar components in the two embodiments will not be repeated herein. The splicing display device 10*a* of this embodiment is different from the splicing display device 10 mainly in that, in the splicing display device 10*a* of this embodiment, an optical layer and an adhesive layer may be optionally omitted in a display device 100*a*.

Specifically, referring to FIG. 2, a capping layer 120*a* may directly cover the light-emitting element 130. The material of the capping layer 120*a* may be, for example, an optical glue or a transparent optical glue, but is not limited thereto. The light-emitting element 130 emits light toward the surface 121 of the capping layer 120*a* away from the substrate layer 110. The light-emitting element 130 may be, for example, a red LED, a green LED, and/or a blue LED, but is not limited thereto.

In this embodiment, from a cross-sectional angle of view, the shortest distance from a side surface 130*a*1 of a light-emitting element 130*a* closest to the seam G to the side surface 124 of the capping layer 120*a* is defined as D1, the shortest distance from a top surface 130*a*2 of the light-emitting element 130*a* to the surface 121 of the capping layer 120*a* is defined as T2, the refractive index of the capping layer 120*a* is defined as n1, and the distance D1, the distance T2, and the refractive index n1 are designed to meet the following equation: $\mathrm{Tan}^{-1}(D1/T2) > \mathrm{Sin}^{-1}(1/n1)$. The top surface 130*a*2 of the light-emitting element 130*a* may be the one of the light-exiting surfaces of the light-emitting element 130*a*, and the top surface 130*a*2 is a surface of the light-emitting element 130*a* facing away from the substrate layer 110. The side surface 130*a*1 of the light-emitting element 130*a* may be one of the light-exiting surfaces of the light-emitting element 130*a*, and the side surface 130*a*1 is the surface of the light-emitting element 130*a* adjacent to the side surface 124 of the capping layer 120*a*, and is a surface of the light-emitting element 130*a* that is closest to the seam G.

In summary, in the display device and splicing display device of the embodiment disclosed in this disclosure, since the distance D from the light-exiting region to the side surface of the capping layer, the thickness T of the capping layer, and the refractive index n1 of the capping layer may meet the equation: $\mathrm{Tan}^{-1}(D/T) > \mathrm{Sin}^{-1}(1/n1)$, optical defects such as a shining edge, a ghost image, or a shadow effect at the seam (or the side surface of the display device in the splicing display device) of the splicing display device may be reduced.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recorded in the embodiments, or to equivalently replace some or all of the technical features; the modifications or replacements do not cause the essence of the corresponding technical solutions to deviate from the scope of the technical solutions of the embodiments.

What is claimed is:

1. A display device, comprising:
   a substrate layer, having a first surface, a second surface opposite to the first surface, and a third surface connected to the first surface and the second surface;
   a trace layer, surrounding the first surface, the second surface and the third surface of the substrate layer in a section;
   a capping layer, disposed on the substrate layer, having a first region; and
   a light-emitting element, disposed on the substrate layer, emitting light toward the first region of the capping layer,
   wherein a distance from the first region to a side surface of the capping layer is defined as D, a thickness of the capping layer is defined as T, a refractive index of the capping layer is defined as n1, and D, T, and nl meet the following equation: $\mathrm{Tan}^{-1}(D/T) > \mathrm{Sin}^{-1}(1/n1)$;
   wherein the first surface of the substrate layer is closer to the capping layer than the second surface, and the light-emitting element is disposed between the first surface of the substrate layer and the capping layer.

2. The display device according to claim 1, further comprising:
   an optical layer, disposed on the capping layer, comprising a color filter layer and a light blocking matrix, wherein the color filter layer is disposed corresponding to the first region, and the light blocking matrix defines a boundary of the first region.

3. The display device according to claim 2, wherein the color filter layer is under the first region of the capping layer in a normal direction of the substrate layer.

4. The display device according to claim 2, wherein the optical layer further comprises a color conversion layer, disposed corresponding to the first region and the color filter layer.

5. The display device according to claim 4, wherein the color conversion layer is under the first region of the capping layer and the color filter layer in a normal direction of the capping layer.

6. The display device according to claim 2, wherein the optical layer is located between the capping layer and the light-emitting element.

7. The display device according to claim 2, further comprising:
   an adhesive layer, disposed between the optical layer and the substrate layer, surrounding the light-emitting element.

8. The display device according to claim 1, further comprising:
   a light absorbing layer, disposed on the side surface of the capping layer.

9. The display device according to claim 1, wherein the thickness of the capping layer is less than a thickness of the substrate layer.

10. The display device according to claim 1, wherein the capping layer comprises polyimide, and the substrate layer comprises glass.

11. The display device according to claim 1, wherein a surface of the capping layer and the side surface of the capping layer have a point of intersection, an angle between light toward the point of intersection and the side surface is θ, and the angle θ is substantially equal to $\mathrm{Tan}^{-1}(D/T)$.

12. The display device according to claim 11, wherein the $\mathrm{Sin}^{-1}(1/n1)$ is substantially a critical angle of the capping layer.

13. The display device according to claim 1, wherein the light-emitting element is disposed between the capping layer and the substrate layer, and the light-emitting element is disposed corresponding to the first region of the capping layer.

14. The display device according to claim 13, wherein the light-emitting element is under the first region of the capping layer in a normal direction of the substrate layer.

15. A splicing display device, comprising:
a plurality of display devices, spliced together, wherein each of the display devices comprises:
   a substrate layer, having a first surface, a second surface opposite to the first surface, and a third surface connected to the first surface and the second surface;
   a trace layer, surrounding the first surface, the second surface and the third surface of the substrate layer in a section;
   a capping layer, disposed on the substrate layer, having a first region; and
   a light-emitting element, disposed on the substrate layer, emitting light toward the first region of the capping layer,
   wherein a distance from the first region to a side surface of the capping layer is defined as D, a thickness of the capping layer is defined as T, a refractive index of the capping layer is defined as n1, and D, T, and n1 meet the following equation: $\mathrm{Tan}^{-1}(D/T) > \mathrm{Sin}^{-1}(1/n1)$;
   wherein the first surface of the substrate layer is closer to the capping layer than the second surface, and the light-emitting element is disposed between the first surface of the substrate layer and the capping layer.

16. A display device, comprising:
a substrate layer, having a first surface, a second surface opposite to the first surface, and a third surface connected to the first surface and the second surface;
a trace layer, surrounding the first surface, the second surface and the third surface of the substrate layer in a section;
a light-emitting element, disposed on the substrate layer; and
a capping layer, disposed on the substrate layer, covering the light-emitting element;
wherein a distance from a side surface of the light-emitting element to a side surface of the capping layer is defined as D1, a distance from a top surface of the light-emitting element to a surface of the capping layer is defined as T2, a refractive index of the capping layer is defined as n1, and D1, T2, and n1 meet the following equation: $\mathrm{Tan}^{-1}(D1/T2) > \mathrm{Sin}^{-1}(1/n1)$;
wherein the first surface of the substrate layer is closer to the capping layer than the second surface, and the light-emitting element is disposed between the first surface of the substrate layer and the capping layer.

17. The display device according to claim 16, wherein the surface of the capping layer is a surface of the capping layer away from the substrate layer, and the light-emitting element emits light toward the surface of the capping layer.

18. The display device according to claim 16, wherein the top surface of the light-emitting element faces away from the substrate layer, and the side surface of the light-emitting element is adjacent to the side surface of the capping layer.

19. The display device according to claim 16, wherein the top surface of the light-emitting element and the side surface of the light-emitting element are light-exiting surfaces.

20. The display device according to claim 16, wherein the surface of the capping layer and the side surface of the capping layer have a point of intersection, an angle between light toward the point of intersection and the side surface is θ, and the angle θ is substantially equal to $\mathrm{Tan}^{-1}(D/T)$.

* * * * *